(12) United States Patent
Liang et al.

(10) Patent No.: US 6,281,545 B1
(45) Date of Patent: Aug. 28, 2001

(54) MULTI-LEVEL, SPLIT-GATE, FLASH MEMORY CELL

(75) Inventors: Mong-Song Liang, Hsin-Chu; Di-Son Kuo, Hsinchu County; Ching-Hsiang Hsu, Hsin-Chu; Ruei-Ling Lin, Kaohsiung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/199,130

(22) Filed: Nov. 24, 1998

Related U.S. Application Data

(63) Continuation of application No. 08/974,459, filed on Nov. 20, 1997, now Pat. No. 5,877,523.

(51) Int. Cl.⁷ .................................................. H01L 29/788
(52) U.S. Cl. ............................ 257/315; 257/314; 257/315; 257/316; 257/320; 257/321; 257/322
(58) Field of Search ..................................... 257/314, 315, 257/316, 320, 321, 322

(56) References Cited

U.S. PATENT DOCUMENTS

| | | | |
|---|---|---|---|
| 5,364,806 | 11/1994 | Ma et al. | 437/43 |
| 5,414,287 | 5/1995 | Hong | 257/316 |
| 5,494,838 | 2/1996 | Chang et al. | 437/43 |
| 5,925,906 | * 7/1999 | Tanaka | 257/314 |
| 5,929,479 | * 7/1999 | Oyama | 257/315 |
| 5,929,480 | * 7/1999 | Hisamune | 257/320 |
| 6,111,287 | * 8/2000 | Arai | 257/317 |

\* cited by examiner

Primary Examiner—Eddie Lee
Assistant Examiner—Edgardo Ortiz
(74) Attorney, Agent, or Firm—George O. Saile; Stephen B. Ackerman; Graham S. Jones, II

(57) ABSTRACT

A semiconductor memory device is formed on a doped semiconductor substrate, and covered with a tunnel oxide layer covered in turn with a doped first polysilicon layer. The first polysilicon layer is patterned into a pair of floating gate electrodes. An interelectrode dielectric layer covers the floating gate electrodes, the sidewalls of the floating gate electrodes and the edges of the tunnel oxide below the floating gate electrodes. A second polysilicon layer overlies the interelectrode dielectric layer and is in turn covered by a tungsten silicide layer. A second dielectric layer covers the tungsten silicide layer. A control gate electrode which spans the pair of floating gate electrodes is formed by the second polysilicon layer, the tungsten silicide and the first and second dielectric layers patterned into a gate electrode stack providing a control gate electrode spanning across the pair of floating gate electrodes. There are source/drain regions in the substrate self-aligned with the control gate electrode.

13 Claims, 6 Drawing Sheets

MULTI-LEVEL, SPLIT-GATE, FLASH MEMORY CELL

This is a continuation of patent application Ser. No. 08/974,459, filing date Nov. 20, 1997 now U.S. Pat. No. 5,877,523, Multi-Level, Split-Gate, Flash Memory Cell And Method Of Manufacture Thereof, assigned to the same assignee as the present invention.

BACKGROUND OF THE INVENTION

1. Field of the Invention

This invention relates to semiconductor memory devices and more particularly to flash memory devices.

2. Description of Related Art

U.S. Pat. No. 5,414,287 of Hong for "Process for High Density Split-Gate Memory Cell for Flash or EPROM"; U.S. Pat. No. 5,494,838 of Chang for "Process of Making EEPROM Memory Device Having A Sidewall Spacer Floating Gate Electrode" and U.S. Pat. No. 5,364,806 of Ma for "Method of Making a Self-Aligned Dual-Bit Split Gate (DSG) Flash EEPROM Cell" show various methods/structures for split-gate Flash or EPROM cells.

SUMMARY OF THE INVENTION

An object of this invention is a multi-level storage cell which increases the density of flash memory devices.

In accordance with this invention, the features are provided, as follows:

1. The single cell provides multi-level storage information.
2. The device has a split-gate structure.
3. Each cell has plural, separated floating gate structures. In particular two floating gate electrodes are located under one control gate electrode so that multi-level storage is achieved by a double split-gate structure.
4. The multi-level storage cell is controlled by charge stored in two separated, individual floating gate electrodes.
5. The multi-level storage cell is fabricated using an ETOX (EPROM with Tunnel OXide) process.

In accordance with another aspect of this invention, a semiconductor memory device comprises the following. A tunnel oxide layer is formed over a doped semiconductor substrate. A doped first polysilicon layer has a thickness of about 1,500 Å formed over the tunnel oxide layer, and the first polysilicon layer is patterned into a pair of floating gate electrodes. A first dielectric layer overlies the top of the floating gate electrodes and is present on the sidewalls thereof, the and the exposed edge of the tunnel oxide layer which lies below the floating gate electrodes. The first dielectric layer also covers the substrate, where it is exposed, aside from the floating gate electrodes. There is a second polysilicon layer overlying the first dielectric layer. A tungsten silicide layer overlies the second polysilicon layer. A second dielectric layer overlies the device covering the tungsten silicide layer. A control gate electrode spans across the pair of floating gate electrodes formed of the second polysilicon layer, the tungsten silicide and the first and second dielectric layers patterned into a gate electrode stack providing a control gate electrode spanning across the pair of floating gate electrodes. There are source/drain regions in the substrate self-aligned with the control gate electrode.

Preferably, the control gate electrode and the floating gate electrodes are patterned into a split-gate structure. The device includes separate floating gate structures with two floating gate electrodes under one control gate electrode. The tunnel oxide layer has a thickness of from about 80 Å to about 100 Å. The first dielectric layer comprises a silicon Oxide/Silicon Nitride/Silicon Oxide (ONO) in a layer having a thickness of from about 150 Å to about 200 Å.

The second polysilicon layer has a thickness of from about 1000 Å to about 2000 Å. The silicide layer has a thickness of from about 1000 Å to about 2000 Å. There is a dielectric cap over the silicide layer formed of silicon dioxide. There are Medium Doped Drain (MDD) ion implanted regions of dopant in the MDD regions in the substrate with a concentration of from about $1\times10^{18}$ atoms/$cm^3$ to about $5\times10^{19}$ atoms/$cm^3$. There are silicon dioxide spacers formed adjacent to the sidewalls. The source/drain ion implanted regions ions are self-aligned with the gate electrode stack which after annealing have a concentration of from about $1\times10^{19}$ atoms/$cm^3$ to about $1\times10^{20}$ atoms/$cm^3$ of dopant in the source/drain regions the substrate.

There are program, erase, and read voltages employed for the cell operation of the device, which are as follows:

|  | Program | | Erase | | |
|---|---|---|---|---|---|
|  | FG1 | FG2 | FG1 | FG2 | Read |
| $V_G$ | 8 V | 12 V | −5 V | −5 V | 5 V |
| VS | 5 V | 0 V | 5 V | 0 V | 0 V |
| $V_D$ | 0 V | 5 V | 0 V | 5 V | 2 V |

Thus, operation of the device is controlled in this way.

Preferably, the multi-level storage is controlled by charge stored in two separated floating gate electrodes.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Process Description

Figure 1:
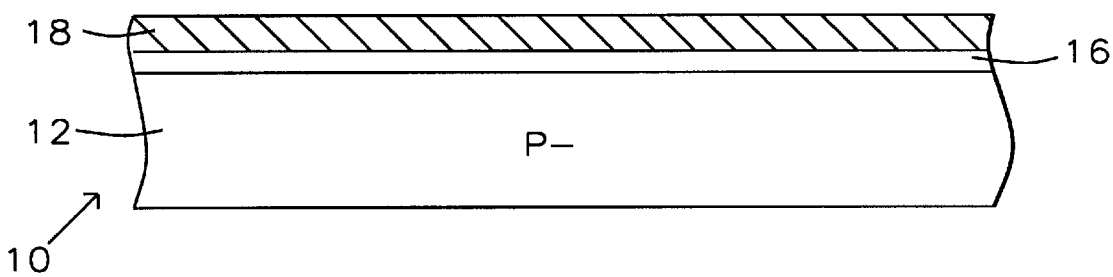
FIG. 1 shows a cross sectional view of a device in the early stages of manufacture in accordance with the process of this invention including a substrate coated with a tunnel oxide layer, covered in turn with a blanket doped polysilicon layer.

Referring to FIG. 1, a cross sectional view of a device 10 is shown with a P-substrate 12 in the early stages of manufacture in accordance with the process of this invention.

The device 10 is processed by a series of the following steps. The active region is formed in the silicon semiconductor substrate as will be well understood by those skilled in the art, followed by active region photolithography to form an active region mask followed by formation of a field oxide pattern through the active region mask followed by P-region field implant through the field oxide pattern formed through the active region mask. A conventional cell implant step follows next.

Next, referring to FIG. 1, follows formation of a blanket tunnel oxide layer 16 formed over P-substrate 12. The tunnel oxide layer 16 has a thickness of from about 80 Å to about 100 Å (which is exaggerated in thickness in the drawings for convenience of illustration. Then, a blanket doped polysilicon layer 18 is formed over the tunnel oxide layer 16 on device 10.

Figure 2:
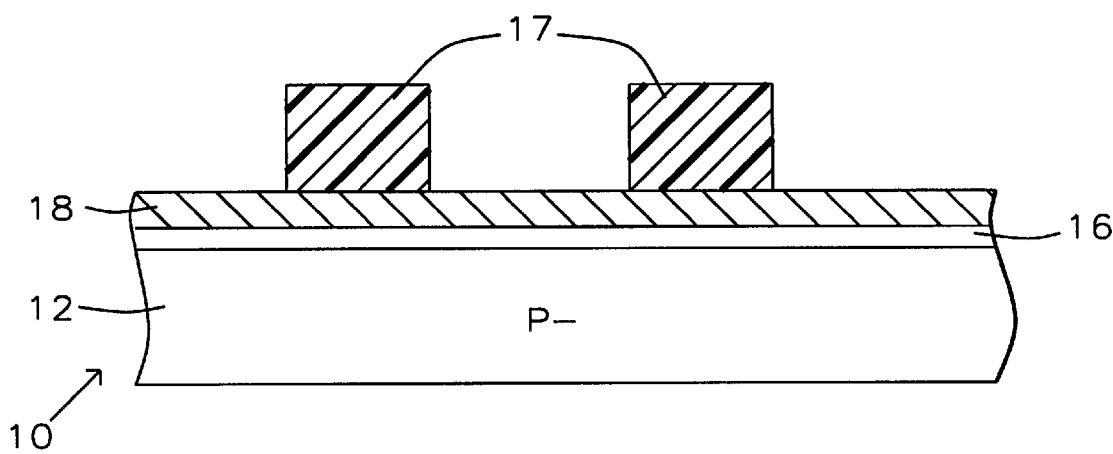
FIG. 2 shows the device of FIG. 1 after the first polysilicon layer has been coated with a photolithographic photoresist mask for patterning the first polysilicon layer in preparation for etching the first polysilicon layer.

FIG. 2 shows the device 10 of FIG. 1 after the first polysilicon layer 18 having a thickness of about 1,500 Å has been coated with a photolithographic photoresist mask 17 for patterning first polysilicon layer 18 in preparation for use in etching the first polysilicon layer 18.

Figure 3:
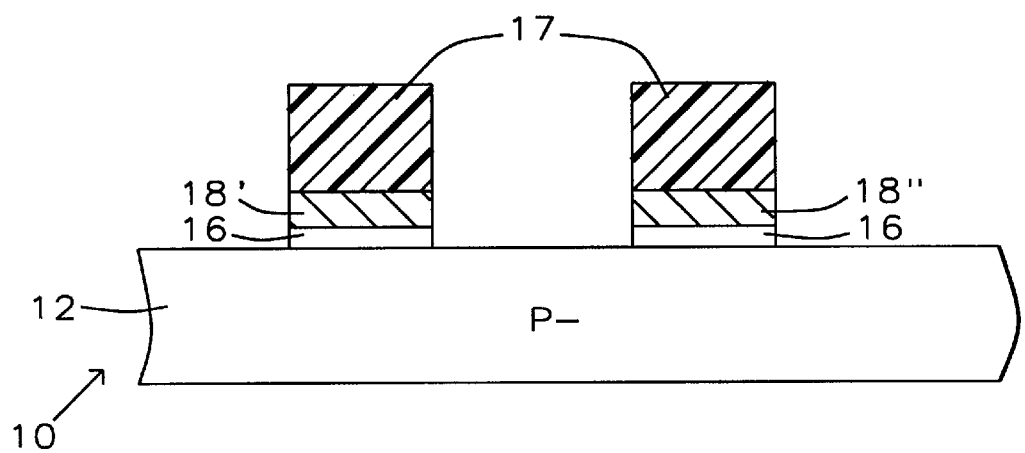
FIG. 3 shows the device of FIG. 2 after the first polysilicon layer has been etched with the pattern of mask to form floating gate electrodes.
Figure 4:
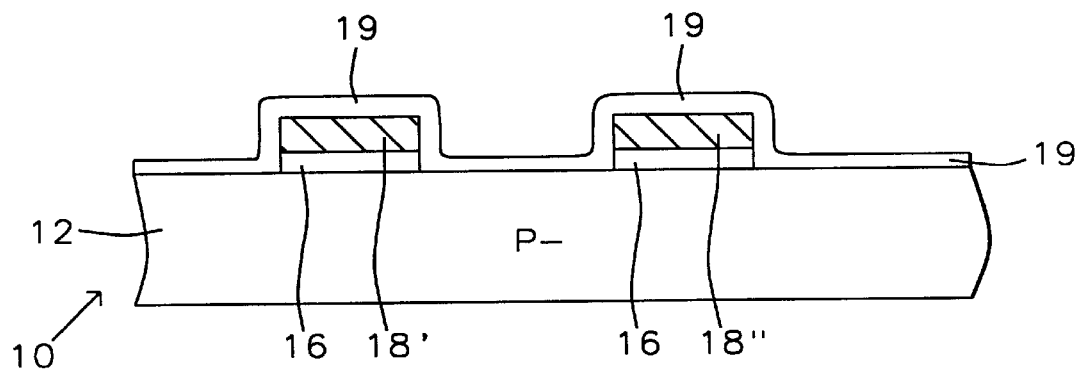
FIG. 4 shows the device of FIG. 3 after mask has been stripped from the device, followed by growth of a blanket interelectrode (first) dielectric layer over tunnel oxide layer by a conventional process.

FIG. 3 shows the device 10 of FIG. 2 after the first polysilicon layer 18 has been etched down through layer 18 and the tunnel oxide layer 16 to the surface of the P-substrate 12 with the pattern of mask 17 to form floating gate electrodes 18' and 18" thereby exposing the edges of the tunnel oxide layer 16, below the floating gate electrodes 18' and 18". Two separate stacks are formed of the spaced apart portions of mask 17, the two floating gate electrodes 18' and 18" and remaining portions of tunnel oxide layer 16 below the two floating gate electrodes 18' and 18" which are spaced apart by a substantial distance. The distance of separation is the distance between the spaced apart portions of mask 17;

FIG. 4 shows the device 10 of FIG. 3 after mask 17 has been stripped from the device 10, followed by growth of a silicon Oxide/silicon Nitride/silicon Oxide (ONO) in a blanket interelectrode (first) dielectric layer 19 over tunnel oxide layer 16 by a conventional process. Blanket layer 19 has a thickness of from about 150 Å to about 200 Å of equivalent oxide thickness. FIG. 4 also shows the device 10 of FIG. 4 after the ONO layer 19 outside the polysilicon area has been etched back (with a mask not shown) during the polysilicon patterning to form interelectrode dielectric structures 19 covering the floating gate electrodes 18' and 18". The portion of dielectric structures 19 seen in FIG. 4 continues to have a thickness of from about 150 Å to about 200 Å. That is to say, while the ONO layer 19 is etched away in the peripheral area, the ONO layer 19 remains intact in the cell array area leaving the ONO layer 19 from about 150 Å to about 200 Å in the area shown in the drawings herein. ONO layer 19 is thin at 150 Å to 200 Å as compared to the thickness of 1500 Å of the two floating gate electrodes 18' and 18".

Thus substantial hollow spaces exist between the two floating gate electrodes 18' and 18" and on either side thereof. The depth of the hollow spaces is substantially undiminished by the thin ONO dielectric layer 19 since layer 19 is only slightly thicker than the tunnel oxide layer 16 (80 Å to 100 Å thick) layer 19 replaces between the electrodes 18' and 18".

Figure 5:
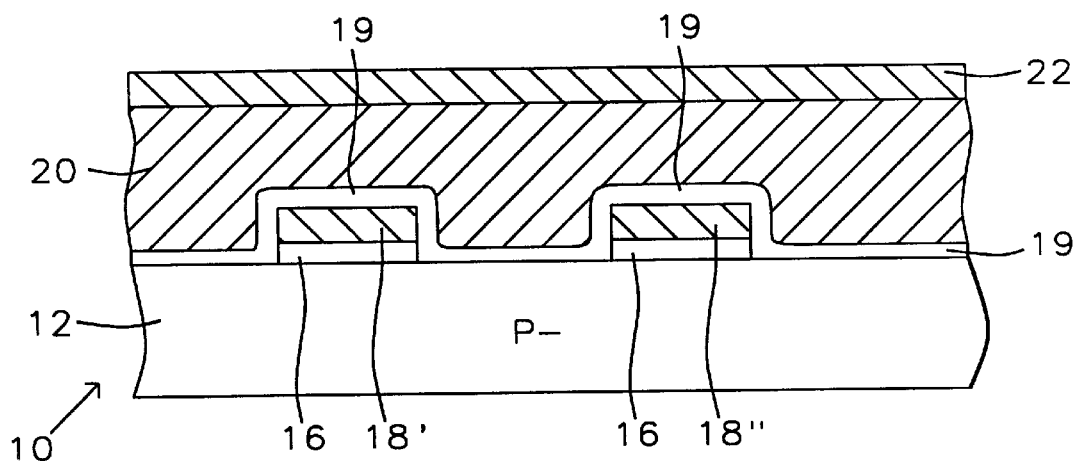
FIG. 5 shows the device of FIG. 4 after a second polysilicon layer is deposited over the floating gate electrodes, and the device has also been covered by a blanket silicide layer.

FIG. 5 shows the device 10 of FIG. 4 after a second polysilicon layer 20 is deposited over the ONO layer 19 covering the floating gate electrodes 18' and 18". The second polysilicon layer 20 has a thickness of from about 1000 Å to about 2000 Å. Layer 20 covers the floating gate electrodes 18' and 18" and also fills the hollow spaces between the two floating gate electrodes 18' and 18" and on either side thereof.

Referring again to FIG. 5 the second polysilicon layer 20 has, in turn, been covered by a blanket tungsten silicide (WSi) layer 22 deposited with a thickness of from about 1000 Å to about 2000 Å which in combination with the layer 20 forms a polycide layer. Thus note that second polysilicon layer 20 extends down between the two floating gate electrodes 18' and 18" to fill the hollow spaces which exist between the two floating gate electrodes 18' and 18" and on either side thereof. Alternative silicide layers to tungsten silicide which can be employed include cobalt silicide or titanium silicide ($CoSi_2$ or $TiSi_2$.)

Figure 6:
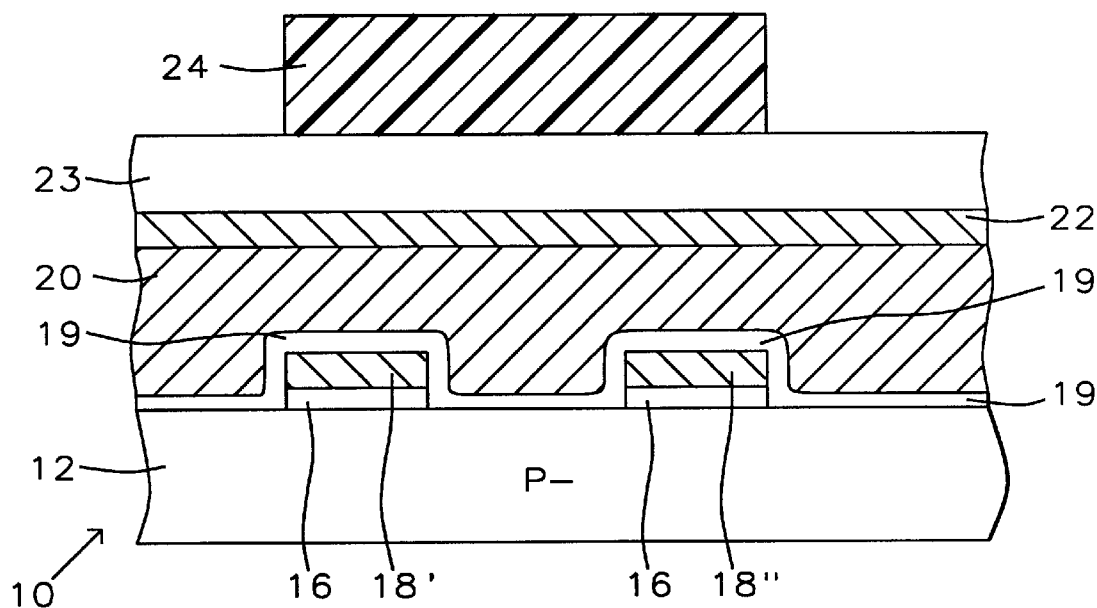
FIG. 6 shows the device of FIG. 5 covered by deposition of a blanket silicon dioxide dielectric cap with a photoresist mask over the cap.

FIG. 6 shows the device 10 of FIG. 5 covered by deposition of a blanket silicon dioxide dielectric cap 23 performed in a reactor by depositing silicon dioxide in an LPCVD reactor in which TetraEthylOrthoSilicate (TEOS) decomposes at from about 650° C. to about 750° C. Next, a process of Split Gate Electrode (SGE) photolithography follows beginning with formation of photoresist mask 24 over dielectric cap 23.

Figure 7:
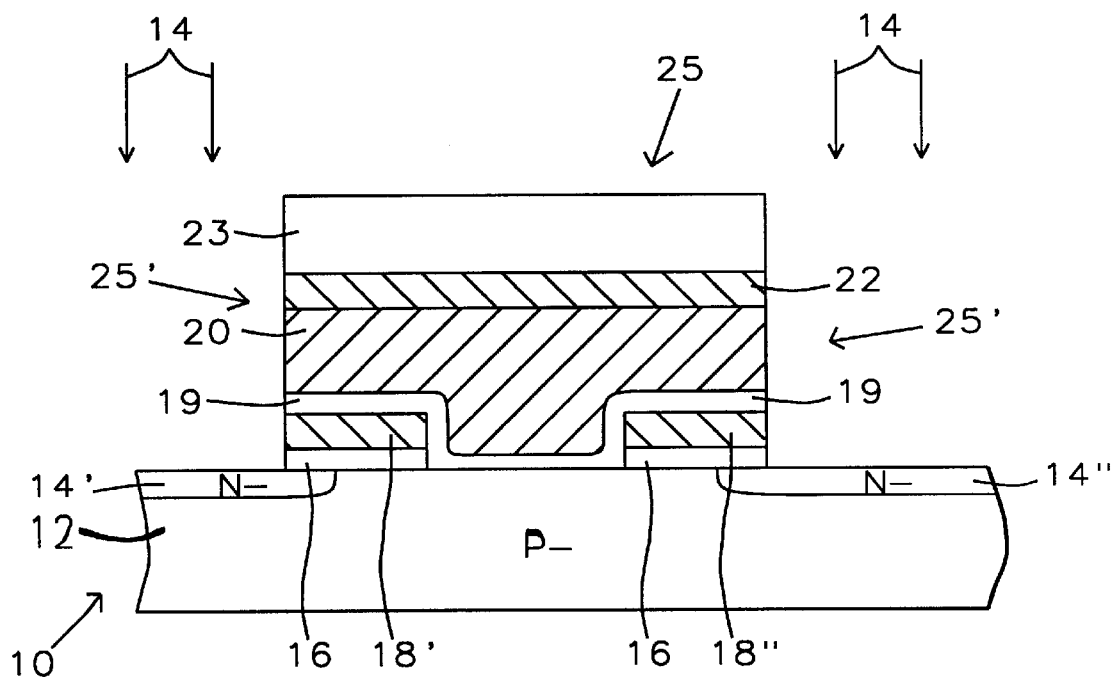
FIG. 7 shows the device of FIG. 6 after etching with the mask has been completed followed by stripping (removal) of mask yielding a gate electrode stack with sidewalls, followed by Medium Doped Drain (MDD) ion implantation with N− dopant ions.

FIG. 7 shows the device 10 of FIG. 6 after etching with the mask 24 has been completed followed by stripping (removal) of mask 24 yielding a gate electrode stack 25 with sidewalls 25". The portions of second polysilicon layer 20 which cover floating gate electrodes 18' and 18" and which extend down to fill the space which exists between the two floating gate electrodes 18' and 18" remain but the portions and on either side thereof are removed and the outer edges of floating gate electrodes 18' and 18" have been exposed. The second polysilicon layer 20 is separated from the substrate 12 by only the thickness of the ONO layer 19.

Next follows a Medium Doped Drain (MDD) Ion Implantation (I/I) with N− dopant ions 14 at an energy level between about 25 keV and about 50 keV with a dose from about $1 \times 10^{14}$ ions/cm$^2$ and about $1 \times 10^{15}$ ions/cm$^2$. After annealing this will yield a concentration of from about $1 \times 10^{18}$ atoms/cm$^3$ to about $5 \times 10^{19}$ atoms/cm$^3$ of dopant in regions 14' and 14' in the substrate 12.

Figure 8:
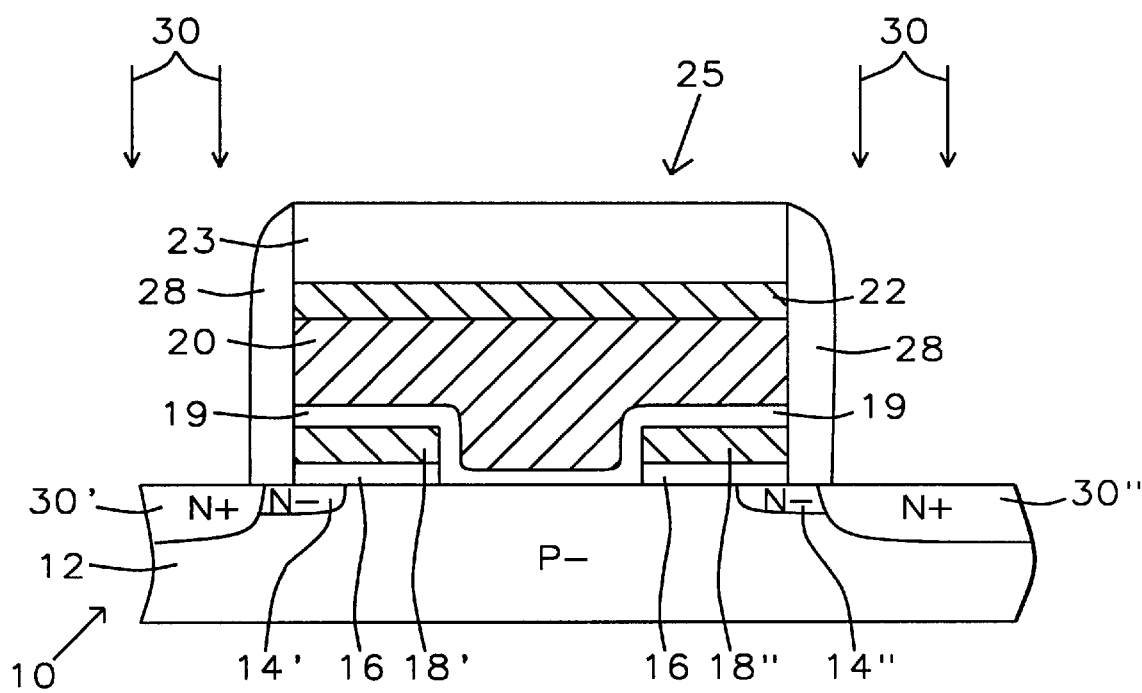
FIG. 8 shows the device of FIG. 7 after formation of silicon dioxide, dielectric spacers adjacent to the sidewalls of the gate electrode stack, followed by conventional N+ photolithography to define the areas where N+ dopant is to be deposited involving a mask not shown since it covers areas not shown in the section shown here, and source/drain ion implantation with N− dopant ions self-aligned with the gate electrode stack and spacers with dopant in the source/drain regions is shown P-substrate leaving portions of the the MDD regions beneath the spacers and between with the MDD regions is the channel of the device.

FIG. 8 shows the device 10 of FIG. 7 after formation of silicon dioxide, dielectric spacers 28 adjacent to the sidewalls 25' of gate electrode stack 25. Spacers 28 are formed by a conventional process of depositing silicon dioxide in a LPCVD TEOS deposition process.

Next follows conventional N+ photolithography to define the areas where N+ dopant is to be deposited involving a mask not shown since it covers areas not shown in the section shown here.

Next follows a source/drain Ion Implantation (I/I) with N− dopant ions 30 self-aligned with the gate electrode stack and spacers 28 aside from the gate electrode stack and below the gate electrode stack. The I/I process is performed at an energy level between about 25 keV and about 40 keV with a dose from about $1\times10^{15}$ ions/cm$^2$ and about $1\times10^{16}$ ions/cm$^2$. After annealing this will yield a concentration of from about $1\times10^{19}$ atoms/cm$^3$ to about $1\times10^{20}$ atoms/cm$^3$ of dopant in the source/drain regions 30'/30" in P-substrate 12 leaving portions of the the MDD regions 14' and 14" beneath the spacers 28. Between the MDD regions 14' and 14" is located the channel C of the device directly below the gate electrode stack.

Next as is conventional in CMOS technology P+ photolithography, and P+ I/I steps follows.

Finally a set of Back End Of the Line (BEOL) steps follow including formation of USG/BPTEOS glass layers, planarization of the glass layers, contact photolithography, contact etching, N+ contact photolithography, N+ contact I/I, blanket P+ Contact I/I, first metallization (AlCu/TiN) deposition, first metallization photolithography, first metallization etching and formation of an alloy.

Figure 9A:
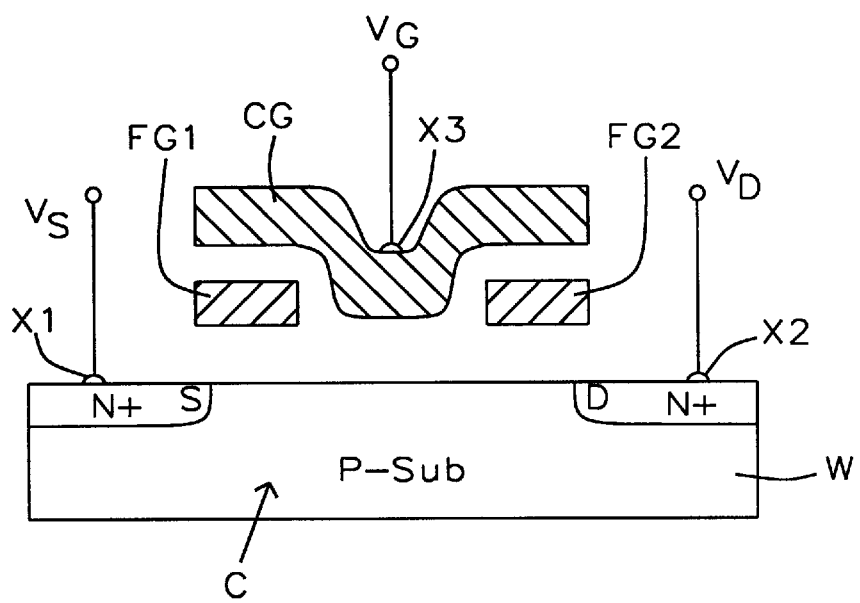
FIG. 9A shows a sectional view of the cell structure of a device in accordance with this invention.
Figure 9B:
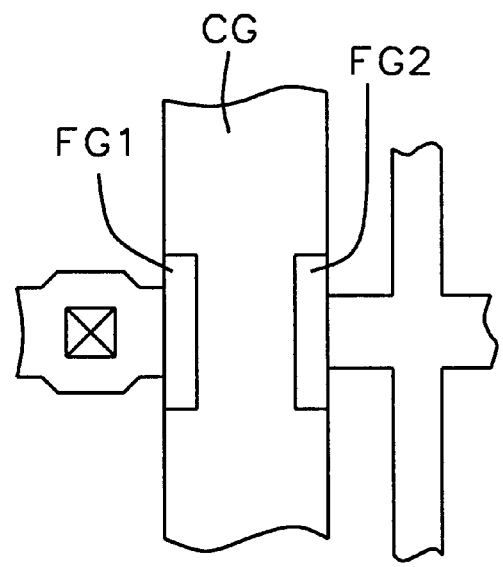
FIG. 9B shows a general plan view of a layout of the device of FIG. 9A.
Figure 9C:
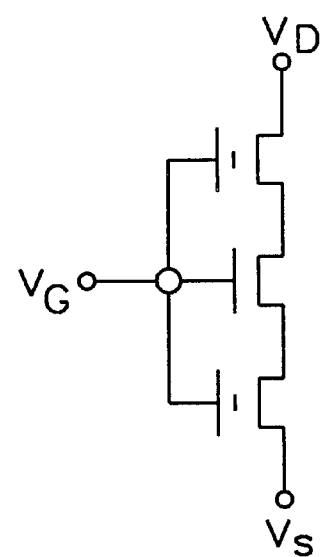
FIG. 9C shows an equivalent circuit of the device of FIGS. 9A and 9B.

FIG. 9A shows a sectional view of the cell structure of a device in accordance with this invention. FIG. 9B shows a general plan view of a layout of the device of FIG. 9A. FIG. 9C shows an equivalent circuit of the device of FIGS. 9A and 9B.

The device of FIGS. 9A and 9B includes a P-substrate W in which a N+ doped regions SID are formed as the source and drain of a device in accordance with this invention. The source region S is connected to voltage $V_S$ through a line to contact X1. The drain region D is connected to voltage $V_D$ through a line to contact X2. Between the source/drain SID regions is the channel C of the device. Above the source/drain regions SID is the space for a tunnel oxide layer (not shown for convenience of illustration) and thereabove are a pair of floating gate electrodes FG1 and FG2 on either side of a channel C self-aligned with the S/D regions. Above the pair of floating gate electrodes FG1 and FG2 and separated therefrom by a silicon dioxide layer (not shown for convenience of illustration) is the control gate electrode CG which is connected to voltage VG through a line to contact X3.

Referring to FIG. 9C it is seen that the split gate structure of FIG. 9A provides the equivalent of two stacked gate FET transistors and an isolation FET transistor.

The program, erase, and read voltages employed for operating the cell of the flash memory device of FIGS. 8, and 9A–9C are as follows:

| Cell Operation | | | | | |
|---|---|---|---|---|---|
| | Program | | Erase | | |
| | FG1 | FG2 | FG1 | FG2 | Read |
| $V_G$ | 8 V | 12 V | −5 V | −5 V | 5 V |
| VS | 5 V | 0 V | 5 V | 0 V | 0 V |
| $V_D$ | 0 V | 5 V | 0 V | 5 V | 2 V |

Thus, operation of the device is controlled in this way.

Figure 10:
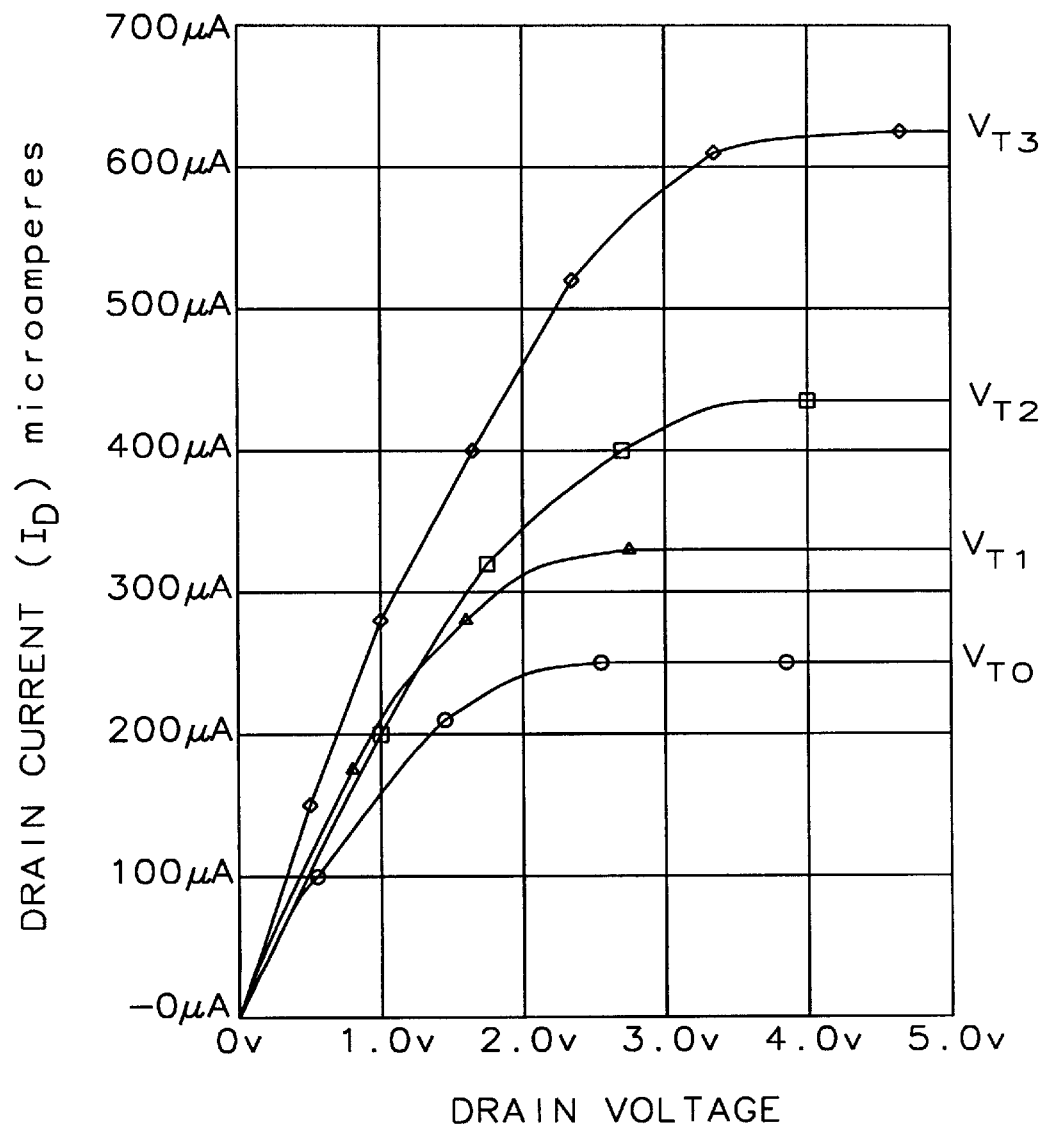
FIG. 10 shows a graph of Drain Current $I_D$ vs. Drain Voltage of a device in accordance with this invention.

FIG. 10 shows a graph of Drain Current $I_D$ vs. Drain Voltage of a device in accordance with this invention.

Summary

The present invention includes the features as follows:
1. Single cell provides multi-level storage information.
2. Split-gate structure.
3. Separated floating gate structures.
4. Two floating gate electrodes under one control gate electrode.
5. Double split-gate structures.
6. Multi-level storage cell which increases the density of flash memory devices.
7. Multi-level storage is achieved by a double split-gate structure.
8. Multi-level storage is controlled by charge stored in two separated floating gate electrodes.
9. Cell is fabricated using conventional ETOX process (ETOX: EPROM with Tunnel OXide), i.e the design is ETOX process compatible.
10. Provides multi-level storage using two separate floating gate electrodes for storage in a single flash memory cell.
11. Different charge storage is provided as follows:
    FG1 causes $V_T$ shifts to $V_{T1}$
    FG2 causes $V_T$ shifts to $V_{T2}$ While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview, i.e. scope, of the present invention and the invention encompasses the subject matter of the claims which follow.

Having thus described the invention, what is claimed as new and desirable to be secured by letters patent is as follows:

1. A semiconductor memory device comprising:
   a doped semiconductor substrate including a channel region therein,
   a tunnel oxide layer formed above said substrate,
   a doped first polysilicon layer over said tunnel oxide layer, said first polysilicon layer and said tunnel oxide layer patterned into a pair of floating gate stacks of a tunnel oxide layer and said first polysilicon layer formed into floating gate electrodes located over said channel region and above said substrate,
   said floating gate stacks comprising a pair of spaced apart stacks of floating gate electrodes and tunnel oxide layers with sidewalls, with said floating gate stacks having a hollow gap therebetween,
   a first thin dielectric layer covering the top and sidewalls of said floating gate electrodes, said tunnel oxide layer and said substrate, leaving said hollow gap between said floating gate electrodes substantially undiminished in depth,
   a second polysilicon layer over said first thin dielectric layer,
   a silicide layer over said second polysilicon layer,
   a dielectric cap layer covering said silicide layer,
   a control gate electrode spanning across said pair of floating gate electrodes in a control gate electrode stack formed of said silicide layer and said second polysilicon layer, said control gate electrode filling said hollow gap between said floating gate stacks above said channel region, source/drain regions formed in said substrate below the level of said control gate electrode stack, and located aside from said channel and said gate electrode stack and self-aligned with said control gate electrode, said control gate electrode and said floating gate electrodes patterned from said tunnel oxide layer forming a split-gate structure above said channel region in said substrate with two separate floating gate electrode structures under one control gate electrode.

2. A device in accordance with claim 1 wherein:
said two floating gate electrodes provide different storage as follows:
FG1 causes $V_T$ shifts to $V_{T1}$, and
FG2 causes $V_T$ shifts to $V_{T2}$.

3. A device in accordance with claim 2 wherein:
program, erase, and read voltages employed for said cell operation of said devise are as follows:

| | Cell Operation | | | | |
|---|---|---|---|---|---|
| | Program | | Erase | | |
| | FG1 | FG2 | FG1 | FG2 | Read |
| $V_G$ | 8 V | 12 V | −5 V | −5 V | 5 V |
| VS | 5 V | 0 V | 5 V | 0 V | 0 V |
| $V_D$ | 0 V | 5 V | 0 V | 5 V | 2 V | whereby operation of said device is controlled.

4. A device in accordance with claim 2 wherein:
multi-level storage is controlled by charge stored in two separated floating gate electrodes.

5. A device in accordance with claim 1 wherein:
said control gate electrode and said floating gate electrodes are patterned into a split-gate structure,
said device includes separate floating gate structures with two floating gate electrodes under one control gate electrode, said tunnel oxide layer is from about 80 Å to about 100 Å thick, and said first poly-silicon layer is about 1,500 Å thick, and said first dielectric layer comprises a silicon Oxide/Silicon Nitride/Silicon Oxide (ONO) in a layer from about 150 Å to about 200 Å thick,
said second polysilicon layer is from about 1000 Å to about 2000 Å thick and said silicide layer is from about 1000 Å to about 2000 Å thick, a dielectric cap over said silicide layer formed of silicon dioxide,
Medium Doped Drain (MDD) ion implanted regions with a concentration of from about $1\times10^{18}$ atoms/cm$^3$ to about $5\times10^{19}$ atoms/cm$^3$ of dopant in said MDD regions in said substrate, and silicon dioxide spacers formed adjacent to said sidewalls,
source/drain ion implanted regions ions self-aligned with said gate electrode stack which after annealing have a concentration of from about $1\times10^{19}$ atoms/cm$^3$ to about $1\times10^{20}$ atoms/cm$^3$ of dopant in said source/drain regions said substrate.

6. A semiconductor memory device comprising:
a doped semiconductor substrate including a channel region therein,
a tunnel oxide layer over said substrate,
a doped first polysilicon layer over said tunnel oxide layer,
said first polysilicon layer and said tunnel oxide layer patterned into a pair of floating gate stacks of a tunnel oxide layer and a first polysilicon layer formed into floating gate electrodes located over said substrate,
said floating gate stacks comprising a pair of spaced apart stacks of floating gate electrodes and tunnel oxide layers formed over said channel region,
said floating gate electrodes having exposed tops and sidewalls and said tunnel oxide layers having exposed sidewalls,
said stacks having a hollow gap therebetween above said channel region,
a first thin dielectric layer covering said tops and sidewalls of said floating gate electrodes and said exposed sidewalls of said tunnel oxide layers and said substrate, said thin dielectric layer leaving said hollow gap between said floating gate electrodes substantially undiminished in depth,
a second polysilicon layer formed over said first thin dielectric layer and a tungsten silicide layer formed over said second polysilicon layer,
a dielectric cap layer covering said tungsten silicide layer,
said tungsten silicide, said second polysilicon layer patterned into a control gate electrode stack spanning across said pair of floating gate electrodes and filling said hollow gap between said stacks above said channel region,
source/drain regions formed in said substrate below said control gate electrode stack, and located aside from said channel and aside from said control gate electrode stack and self-aligned with said control gate electrode stack,
said control gate electrode and said floating gate electrodes patterned from said tunnel oxide layer forming a split-gate structure above a channel region in said substrate with two separate floating gate electrode structures under one control gate electrode.

7. A device in accordance with claim 6 wherein:
said control gate electrode and said floating gate electrodes are patterned to form a split-gate structure.

8. A device in accordance with claim 6 wherein:
said device includes separate floating gate structures with two floating gate electrodes under one control gate electrode.

9. A device in accordance with claim 6 wherein:
said control gate electrode and said floating gate electrodes are patterned to form a split-gate structure and said device includes separate floating gate structures with two floating gates under one control gate electrode.

10. A device in accordance with claim 6 wherein:
said two floating gate electrodes provide different storage as follows:
FG1 causes $V_T$ shifts to $V_{T1}$, and
FG2 causes $V_T$ shifts to $V_{T2}$.

11. A device in accordance with claim 6 wherein:
program, erase, and read voltages employed for said cell operation of said device are as follows:

| | Program | | Erase | | |
|---|---|---|---|---|---|
| | FG1 | FG2 | FG1 | FG2 | Read |
| $V_G$ | 8 V | 12 V | −5 V | −5 V | 5 V |
| VS | 5 V | 0 V | 5 V | 0 V | 0 V |
| $V_D$ | 0 V | 5 V | 0 V | 5 V | 2 V | whereby operation of said device is controlled.

12. A device in accordance with claim 6 wherein:
said control gate electrode and said floating gate electrodes are patterned into a split-gate structure,
said device includes separate floating gate structures with two floating gate electrodes under one control gate electrode, said tunnel oxide layer is from about 80 Å to about 100 Å thick, and said first poly-silicon layer is about 1500 Å thick, and said first dielectric layer comprises a silicon Oxide/Silicon Nitride/Silicon Oxide (ONO) in a layer from about 150 Å to about 200 Å thick, said second polysilicon layer is from about 1000 Å to about 2000 Å thick and said silicide layer is from about 1000 Å to about 2000 Å thick, a dielectric cap over said silicide layer formed of silicon dioxide, Medium Doped Drain (MDD) ion implanted regions a concentration of from about $1\times10^{19}$ atoms/cm$^3$ to about $5\times10^{19}$ atoms/cm$^3$ of dopant in said MDD regions in said substrate, and silicon dioxide spacers formed adjacent to said sidewalls, source/drain ion implanted regions ions self-aligned with said gate electrode stack which after annealing have a concentration of from about $1\times10^{19}$ atoms/cm$^3$ to about $1\times10^{20}$ atoms/cm$^3$ of dopant in said source/drain regions said substrate.

13. A device in accordance with claim 6 wherein:

multi-level storage is controlled by charge stored in two separated floating gate electrodes.

* * * * *